(12) United States Patent
Lee et al.

(10) Patent No.: US 7,436,001 B2
(45) Date of Patent: Oct. 14, 2008

(54) VERTICAL GAN-BASED LED AND METHOD OF MANUFACTURING THE SAME

(75) Inventors: Jae Hoon Lee, Suwon (KR); Bang Won Oh, Seongnam (KR); Hee Seok Choi, Seoul (KR); Jeong Tak Oh, Suwon (KR); Seok Beom Choi, Daejeon (KR); Su Yeol Lee, Seongnam (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 5 days.

(21) Appl. No.: 11/490,254

(22) Filed: Jul. 21, 2006

(65) Prior Publication Data
US 2007/0018187 A1   Jan. 25, 2007

(30) Foreign Application Priority Data
Jul. 22, 2005   (KR)   ............. 10-2005-0066621

(51) Int. Cl.
   *H01L 27/15*   (2006.01)
(52) U.S. Cl. .................. 257/98; 257/88; 257/93; 257/99; 257/101; 257/E25.032
(58) Field of Classification Search .................. 257/98, 257/79, 88, 93, 99, 101, E25.032, E33.074; 438/27
See application file for complete search history.

(56) References Cited

U.S. PATENT DOCUMENTS

| 5,779,924 | A | 7/1998 | Krames et al. | |
|---|---|---|---|---|
| 6,559,467 | B2 * | 5/2003 | Nikolaev et al. | 257/12 |
| 2003/0222263 | A1 | 12/2003 | Choi | |
| 2004/0119082 | A1 * | 6/2004 | Sugawara | 257/94 |

* cited by examiner

*Primary Examiner*—A. Sefer
*Assistant Examiner*—Scott R Wilson
(74) *Attorney, Agent, or Firm*—McDermott Will & Emery LLP

(57) ABSTRACT

A vertical GaN-based LED and a method of manufacturing the same are provided. The vertical GaN-based LED includes an n-electrode, a first n-type GaN layer, a first AlGaN layer, a GaN layer, a second AlGaN layer, a second n-type GaN layer, an active layer, a p-type GaN layer, and a structure support layer. The first n-type GaN layer has uneven patterns having a plurality of protuberances. The first AlGaN layer is formed under the first n-type GaN layer, and the GaN layer is formed under the first AlGaN layer. The active layer is formed under the second n-type GaN layer, and the p-type GaN layer is formed under the active layer. A p-electrode is formed under the p-type GaN layer, and the structure support layer is formed under the p-electrode.

19 Claims, 8 Drawing Sheets

[FIG. 1]
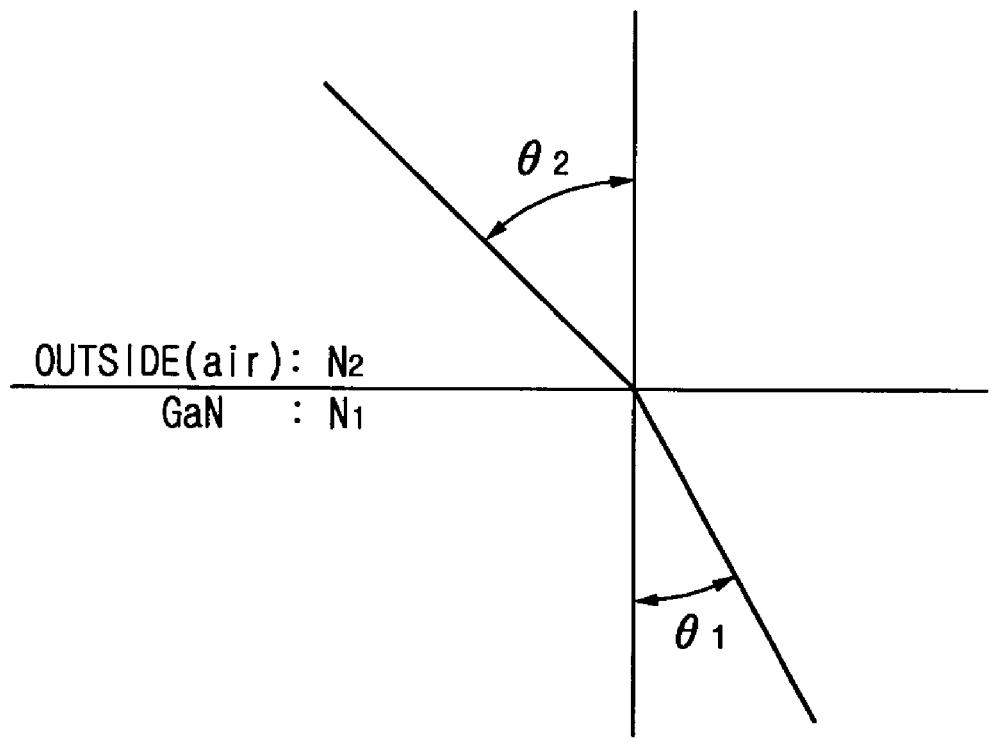
$N_1 \sin\theta_1 = N_2 \sin\theta_2$
[FIG. 2A]
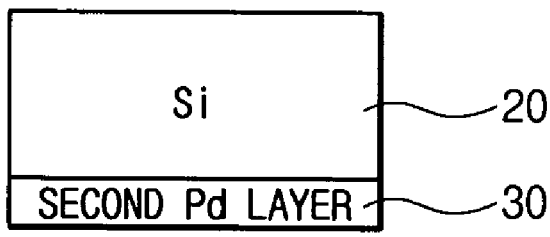
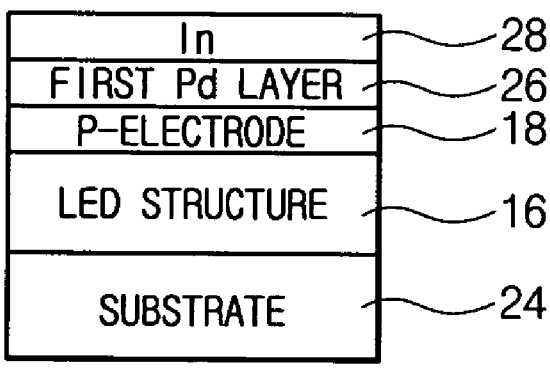

[FIG. 2B]
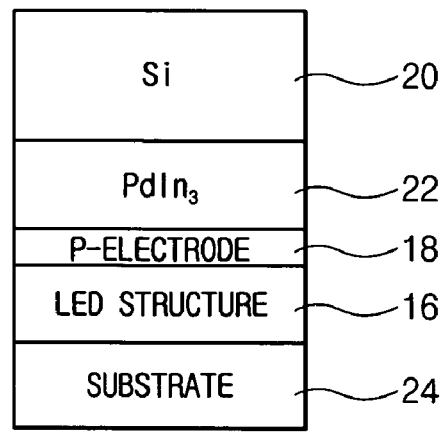
[FIG. 2C]
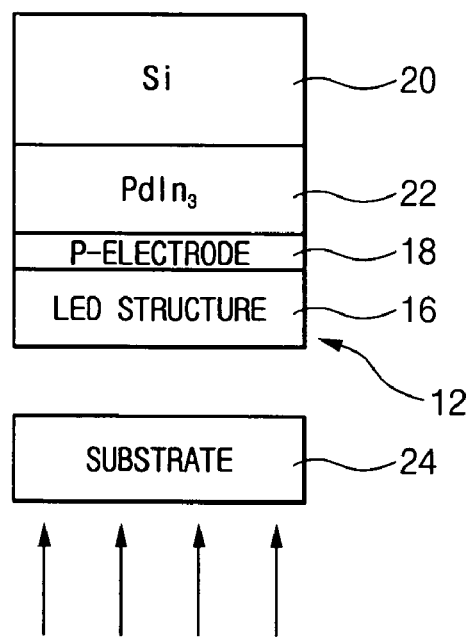
[FIG. 3A]
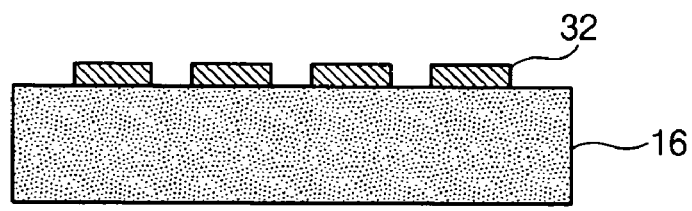
[FIG. 3B]
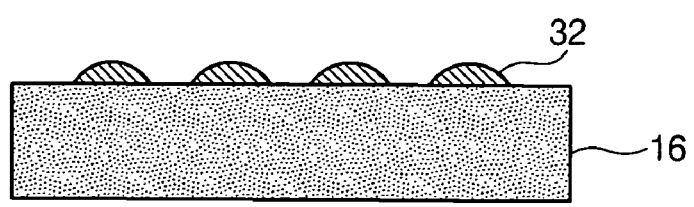

[FIG. 3C]
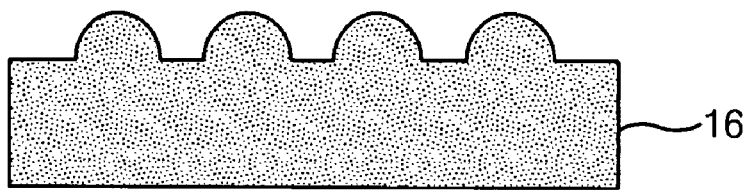
[FIG. 4]
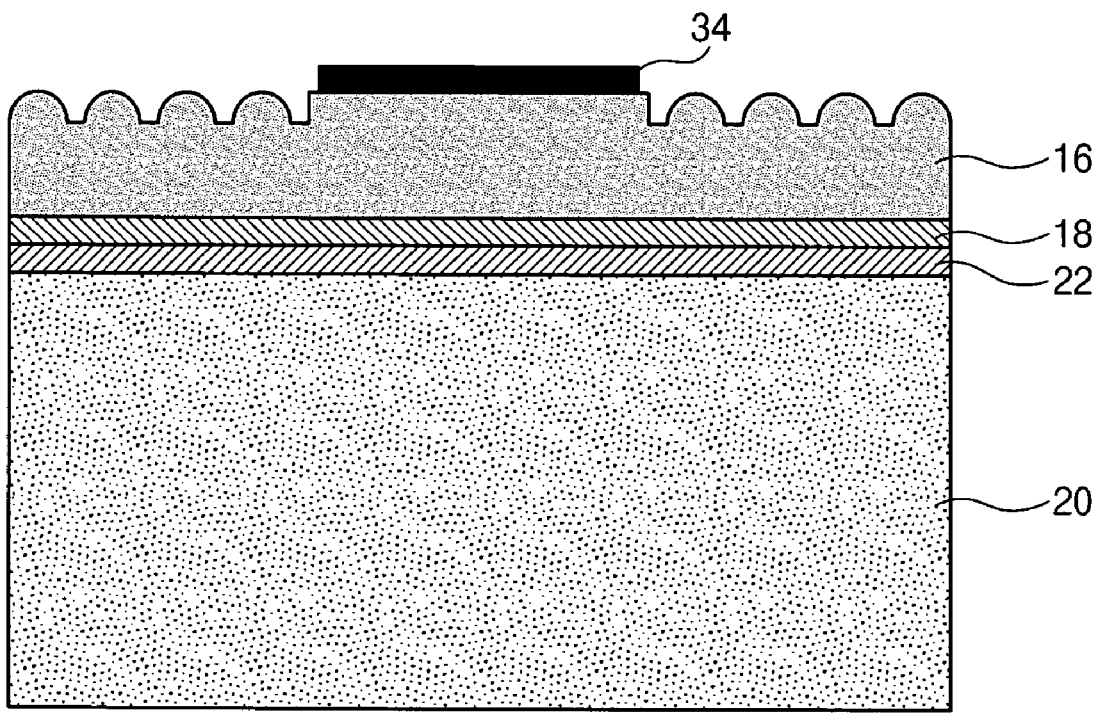

[FIG. 5]
[FIG. 6]
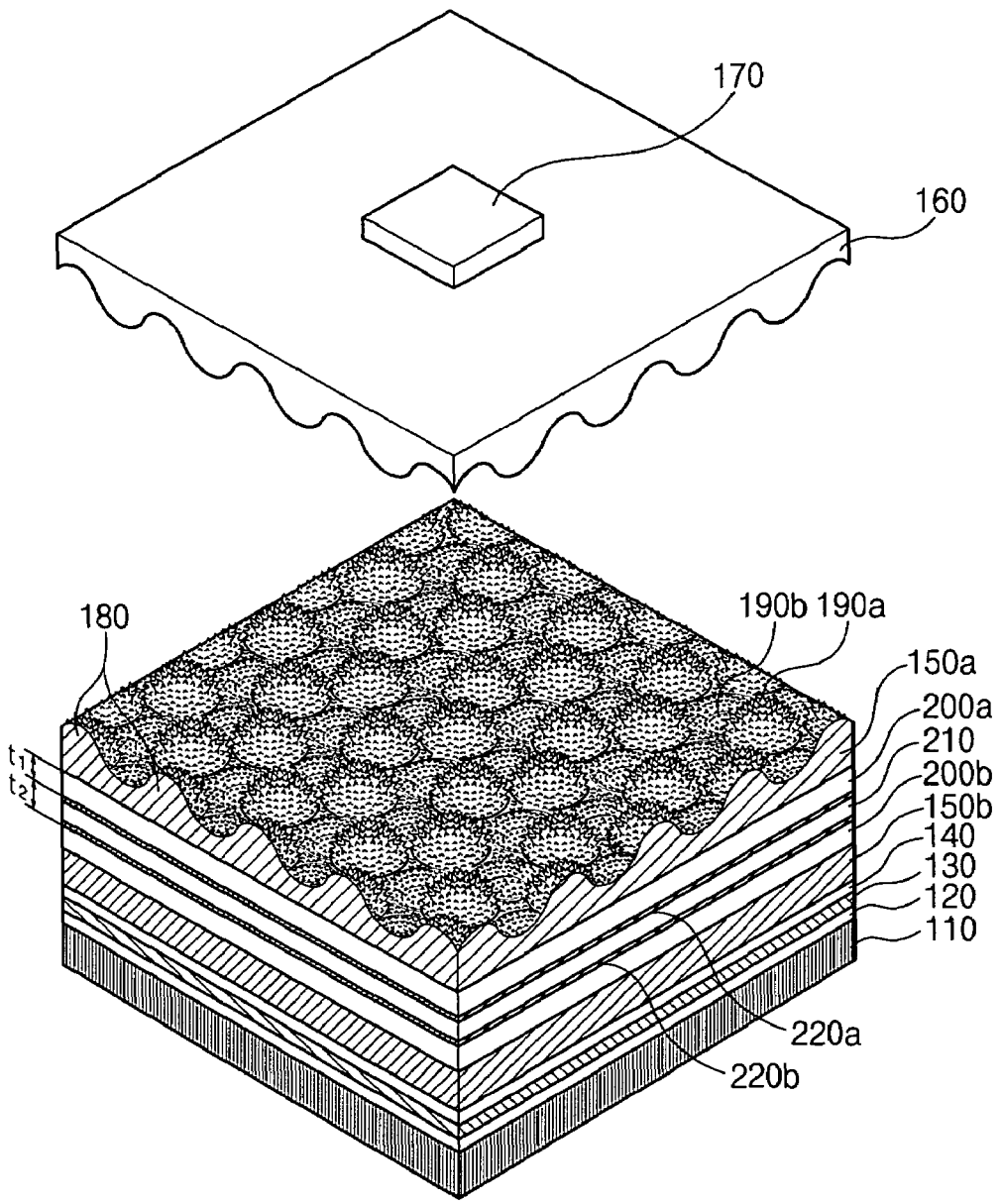

[FIG. 7A]
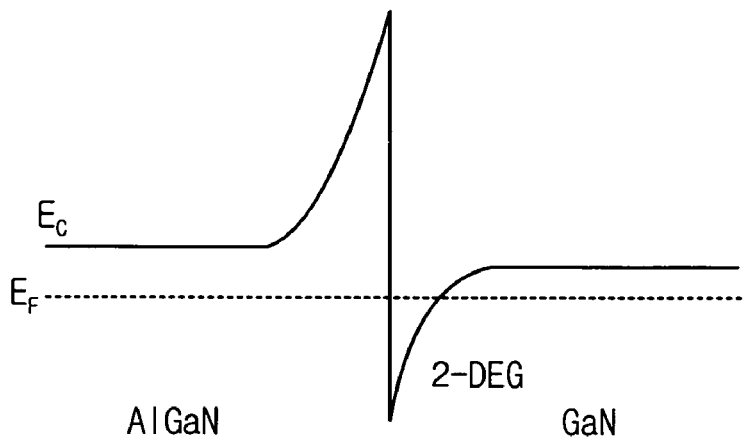
[FIG. 7B]
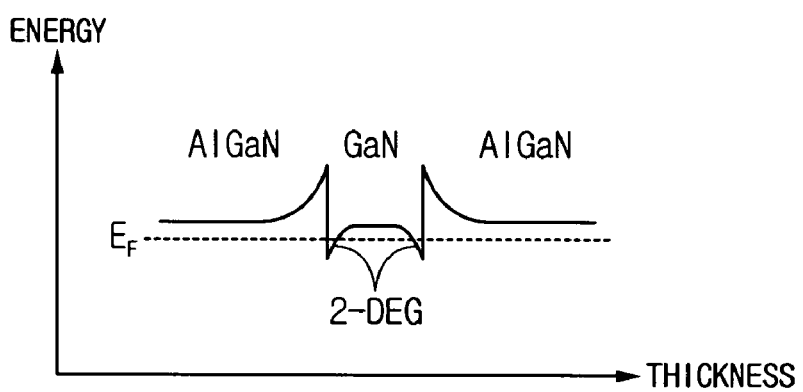
[FIG. 8A]
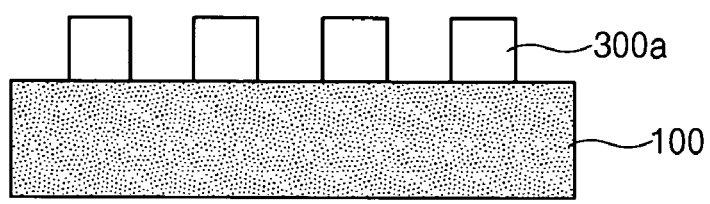
[FIG. 8B]
[FIG. 8C]
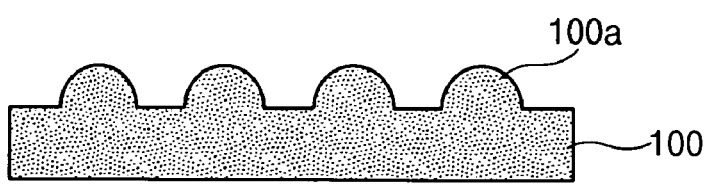

[FIG. 8D]
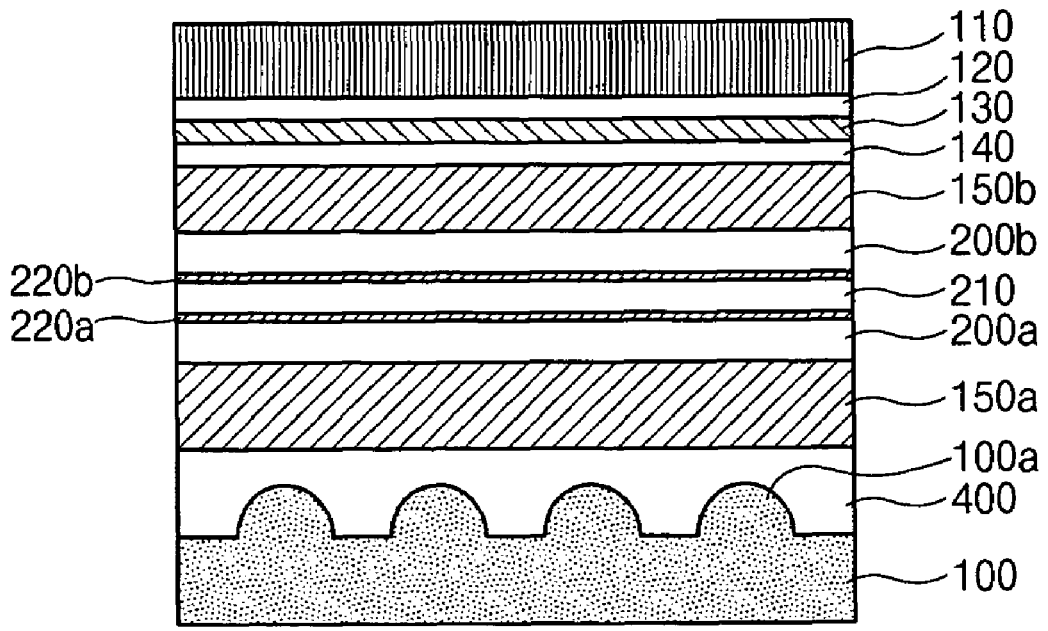
[FIG. 8E]
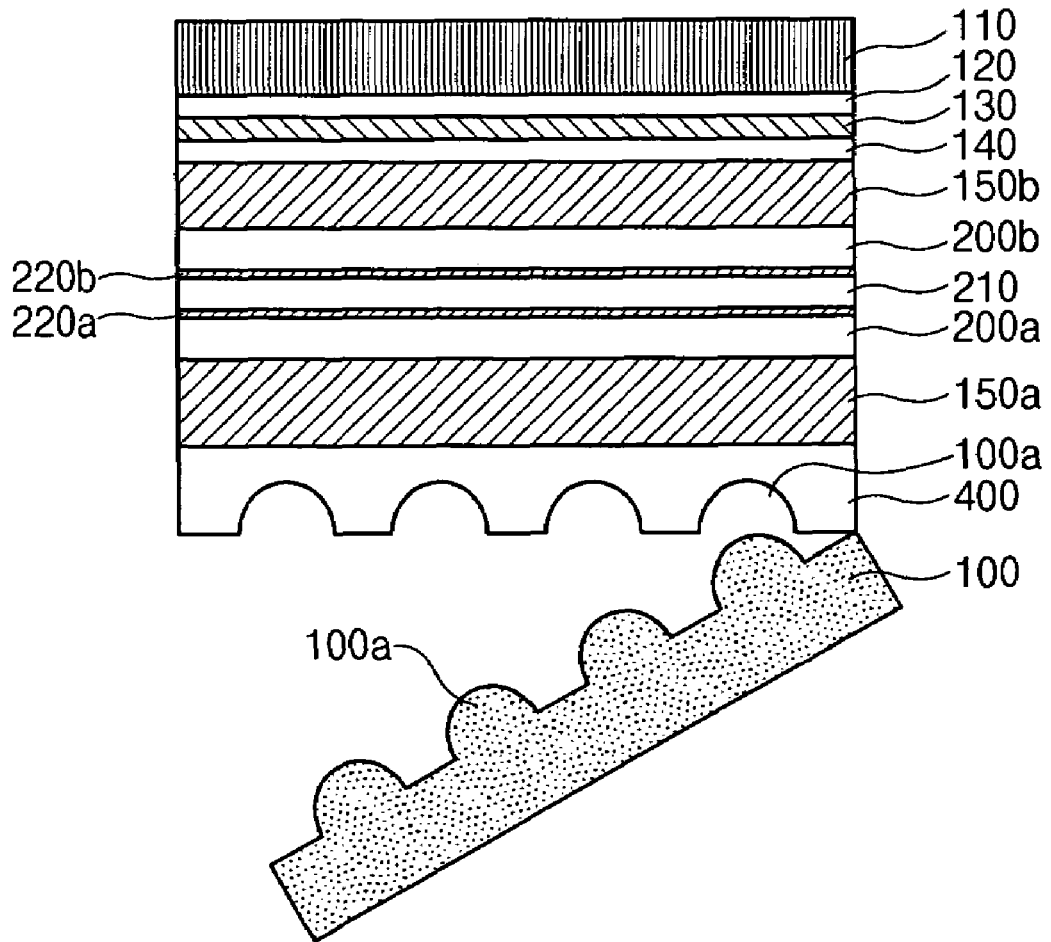

[FIG. 8F]
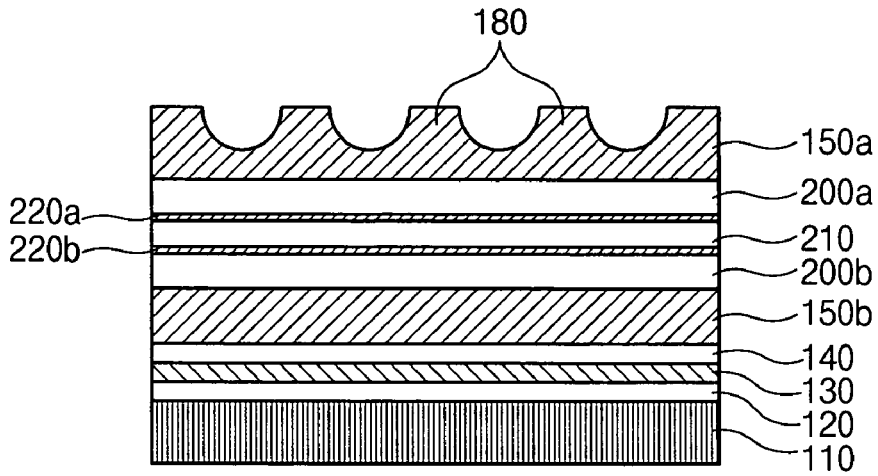
[FIG. 8G]
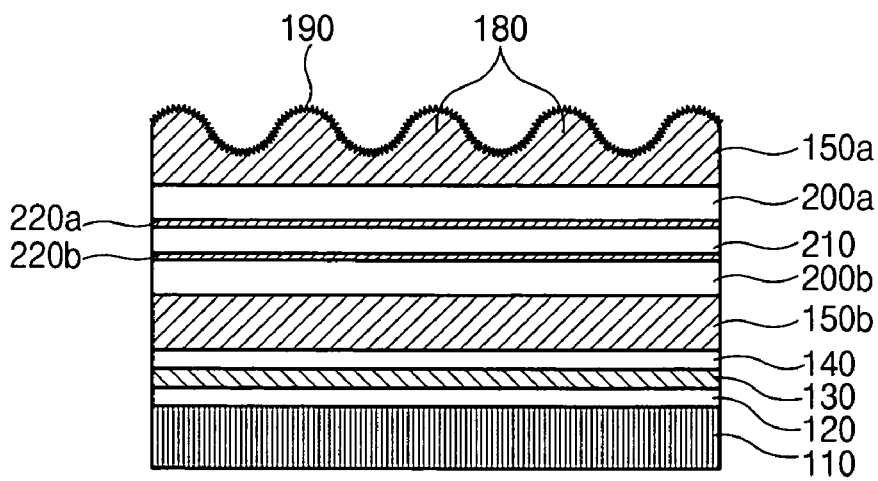
[FIG. 8H]
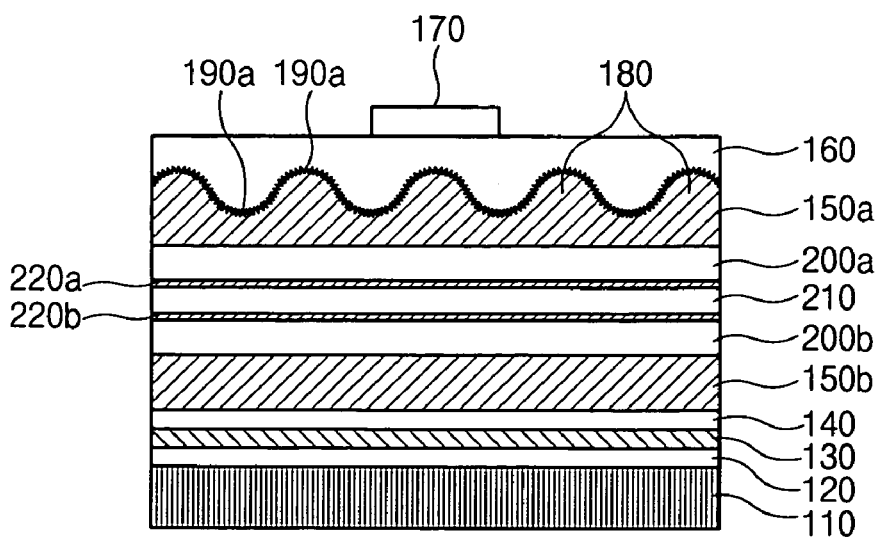

[FIG. 9]
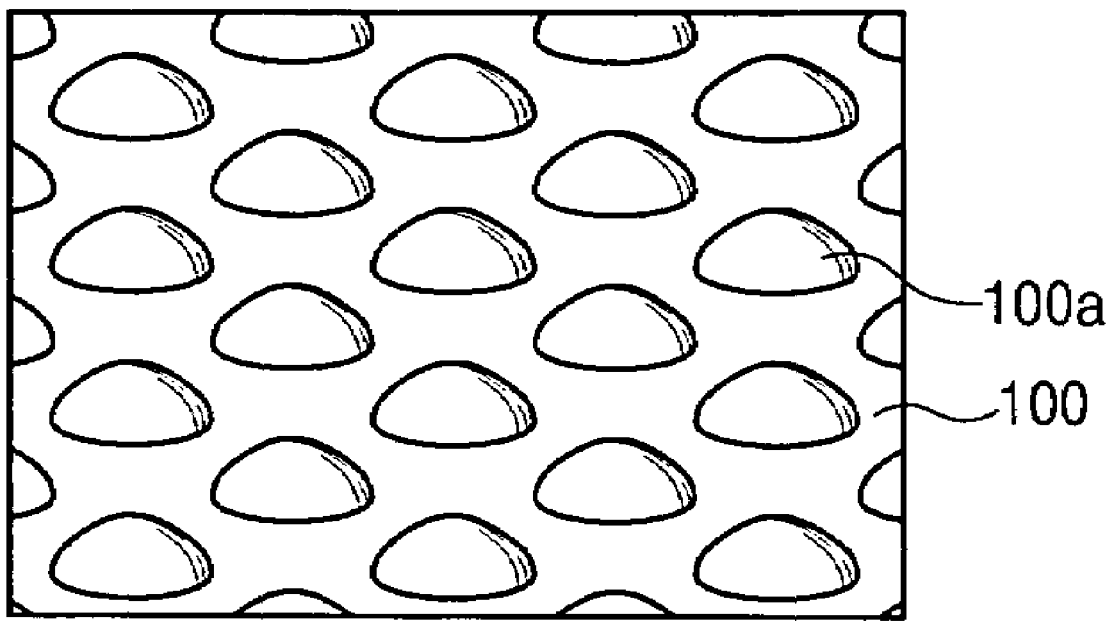

VERTICAL GAN-BASED LED AND METHOD OF MANUFACTURING THE SAME

CROSS-REFERENCE TO RELATED APPLICATIONS

This application claims the benefit of Korean Patent Application No. 2005-0066621 filed with the Korea Intellectual Property Office on Jul. 22, 2005, the disclosure of which is incorporated herein by reference.

BACKGROUND OF THE INVENTION

1. Field of the Invention

The present invention relates to a vertical (vertical-electrode-type) GaN-based light emitting diode (LED) and a method of manufacturing the same, and more particularly, to a vertical GaN-based LED and a method of manufacturing the same, capable of increasing the external quantum efficiency and the manufacturing yield by optimizing the current diffusion effect and increasing the light-extraction efficiency.

2. Description of the Related Art

Generally, a GaN-based LED is grown on a sapphire substrate, but the sapphire substrate is a rigid nonconductor and has poor thermal conductivity. Therefore, there is a limitation in reducing the manufacturing costs by decreasing the size of a GaN-based LED, or improving the optical power and chip characteristic. Particularly, because application of a high current is essential for achieving high power LED, it is important to solve a heat-sink problem of the LED. To solve this problem, there has been proposed a vertical GaN-based LED in which a sapphire substrate is removed using a laser lift-off (LLO).

However, the conventional vertical GaN-based LED has a problem in that photon generated from an active layer is emitted to the outside of the LED. That is, an external quantum efficiency is degraded.

FIG. 1 is a graph for explaining the reduction of an external quantum efficiency in a conventional vertical GaN-based LED. Referring to FIG. 1, an incident angle $\theta_1$ at which photon is incident from a GaN layer to air should be less than a critical angle $\theta_c$ so that photon generated from an active layer can pass through the GaN layer having a refractive index $N_1$ greater than a refractive index $N_2$ of air and then escape into air.

When an escape angle $\theta_2$ at which the photon escapes into air is 90°, the critical angle $\theta_c$ is defined as $\theta_c = \sin^{-1}(N_2/N_1)$. When light propagates from the GaN layer to air having a refractive index of 1, a critical angle is about 23.6°.

When the incident angle $\theta_1$ is greater than the critical angel $\theta_c$, photon is totally reflected at an interface between the GaN layer and the air and goes back into the LED. Then, the photon is confined inside the LED, so that the external quantum efficiency is greatly reduced.

To prevent the reduction of the external quantum efficiency, U.S Patent Publication No. 20030222263 discloses that hemispherical convex patterns are formed on the surface of an n-type GaN layer to reduce an incident angle $\theta_1$ of a photo incident to air from the GaN layer below a critical angle $\theta_c$.

A method for manufacturing a vertical GaN-based LED disclosed in U.S. Patent Publication No. 20030222263 will be described with reference to FIGS. 2 to 4.

FIGS. 2A to 2C are sectional views illustrating a method of manufacturing the vertical GaN-based LED disclosed in U.S. Patent Publication No. 20030222263, FIGS. 3A to 3C are enlarged sectional views illustrating a method of manufacturing the vertical GaN-based LED, and FIG. 4 is a sectional view of the vertical GaN-based LED manufactured through the method of FIGS. 2A to 2C and FIGS. 3A to 3C.

Referring to FIG. 2A, an LED structure 16 having GaN and a positive electrode (p-electrode) 18 are formed on a sapphire substrate 24, and a first Pd layer 26 and an In layer 28 are formed on the p-electrode 18. A second Pd layer is formed under a silicon substrate 20.

Referring to FIG. 2B, the silicon substrate 20 where the second Pd layer 30 is formed is attached to the p-electrode 18 where the first Pd layer 26 and the In layer 28 are formed.

Referring to FIG. 2C, the sapphire substrate 24 is removed using an LLO process.

Referring to FIG. 3A, photoresist patterns 32 are formed on predetermined portions of the surface of the exposed LED structure 16 (more specifically, the surface of the n-type GaN layer).

Referring to FIG. 3B, the photoresist patterns 32 are formed in a hemispherical shape through a re-flow process.

Referring to FIG. 3C, the surface of the LED structure 16 is etched through an anisotropic etching process so as to be patterned in a hemispherical shape.

Referring to FIG. 4, a negative electrode (n-electrode) 34 is formed on the LED structure 16. Through these procedures, the vertical GaN-based LED having the LED structure 16 whose surface is patterned is completed.

However, according to the vertical GaN-based LED manufactured by the method disclosed in U.S. Patent Publication No. 20030222263, when the LED structure 16 has a thickness of 10 μm or less (thin GaN), the process of forming the photoresist patterns 32 and subsequent processes are difficult to carry out even if the silicon substrate acting as a sub support is used. Accordingly, the manufacturing yield significantly decreases.

In addition, because the patterns for improving the external quantum efficiency are formed in a convex hemispherical shape on the surface of the LED structure, the surface of the LED structure on which the patterns can be formed is limited. Accordingly, the improvement of the external quantum efficiency that can be obtained by applying the convex hemispherical patterns is not sufficient. Therefore, there is a demand for a new method that can maximize the improvement of the external quantum efficiency.

Furthermore, because the surface of the LED structure (more specifically, the n-type GaN layer) contacting the n-electrode is formed by doping n-type conductive impurities (e.g., Si) into an undoped GaN layer, the LED structure has high doping concentration. Therefore, current crowding occurs only at a lower portion of the n-electrode contacting the surface of the LED structure and a current does not diffuse over an entire active layer. Consequently, the light-extraction efficiency of the LED is degraded and the lifespan of the LED is reduced.

SUMMARY OF THE INVENTION

An advantage of the present invention is that it provides a vertical GaN-based LED that can maximize the improvement of an external quantum efficiency by forming uneven patterns as a macroscopic structure so as to increase a surface area and forming a plurality of protuberances, which are fine light-scattering structures, on a surface of the uneven patterns. Also, the vertical GaN-based LED can achieve a high power characteristic by improving the current dispersion effect.

Another advantage of the present invention is that it provides a method of manufacturing the vertical GaN-based LED.

Additional aspects and advantages of the present general inventive concept will be set forth in part in the description which follows and, in part, will be obvious from the description, or may be learned by practice of the general inventive concept.

According to an aspect of the invention, a vertical GaN-based LED includes an n-electrode; a first n-type GaN layer having uneven patterns having a plurality of protuberances for increasing a surface area and formed under the n-electrode; a first AlGaN layer formed under the first n-type GaN layer; a GaN layer formed under the first AlGaN layer; a second AlGaN layer formed under the GaN layer; a second n-type GaN layer formed under the second AlGaN layer; an active layer formed under the second n-type GaN layer; a p-type GaN layer formed under the active layer; a p-electrode formed under the p-type GaN layer; and a structure support layer formed under the p-electrode.

Each of the uneven patterns has a lower width of 0.5 μm to 5 μm and has a height of 0.1 μm to 5 μm.

Each of the uneven patterns has a lateral side tapered upwardly, and preferably, has a hemispherical pattern arranged vertically and horizontally.

The uneven patterns are arranged at an interval of 0.1 μm to 5 μm.

The vertical GaN-based LED further includes a plurality of protuberances additionally formed in regions between the uneven patterns, and the plurality of protuberances are formed at a period of 0.001 μm to 5 μm and at a height of 0.001 μm to 2 μm.

Each of the first AlGaN layer and the second AlGaN layer has a thickness of 100 Å to 500 Å. The first AlGaN layer and the second AlGaN layer are formed such that Al content is in a range of 10% to 50% in consideration of crystalinity. In this case, the GaN layer is formed to have a thickness of 50 Å to 500 Å in order to form a two-dimensional (2D) electron-gas layer.

Each of the first AlGaN layer and the second AlGaN layer includes one of silicon and oxygen as impurities. At this point, the oxygen can act as a donor such as Si.

The vertical GaN-based LED further includes a transparent conductor layer located between the n-electrode and the first n-type GaN layer, and formed on an entire surface of the n-type GaN layer.

According to another aspect of the invention, a method of manufacturing a vertical GaN-based LED, the method includes: patterning a surface of a sapphire substrate into uneven patterns; forming a buffer layer on the sapphire substrate patterned into the uneven patterns; forming a first n-type GaN layer on the buffer layer; forming a first AlGaN layer on the first n-type GaN layer; forming a GaN layer on the first AlGaN layer such that a 2D-electron gas layer is formed in a junction interface of the first AlGaN layer; forming a second AlGaN layer on the GaN layer such that a 2D-electron gas layer is formed in a junction interface of the GaN layer; forming a second n-type GaN layer on the second AlGaN layer; forming an active layer on the second n-type GaN layer; forming a p-type GaN layer on the active layer; forming a p-electrode on the p-type GaN layer; forming a structure support layer on the p-electrode; removing the sapphire substrate to expose the buffer layer having a surface of the uneven patterns; etching the exposed buffer layer and a surface of the first n-type GaN layer such that a surface of the first GaN layer has uneven patterns; forming a plurality of protuberances on the surface of the first GaN layer that has the uneven patterns; and forming an n-electrode on the first n-type GaN layer where the plurality of protuberances are formed.

The patterning the surface of the sapphire substrate includes: forming a photoresist pattern having a predetermined shape on the sapphire substrate; processing the photoresist pattern such that the photoresist pattern has a desired cross-sectional shape; and etching the processed photoresist pattern and the sapphire substrate, simultaneously, to pattern a surface of the sapphire substrate into uneven patterns.

The processing of the photoresist pattern includes re-flowing the photoresist pattern such that the photoresist pattern patterns have a lateral side tapered upwardly.

The processed photoresist patterns are hemispherical patterns arranged vertically and horizontally.

The forming of the plurality of protuberances includes performing a wet etching process on a surface of the first n-type GaN layer where the uneven patterns are formed.

The method further includes, after the forming of the first AlGaN layer and the second AlGaN layer, annealing the AlGaN layer under oxygen atmosphere.

The method further includes, before the forming of the n-electrode, forming a transparent conductor layer on the first n-type GaN layer.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a diagram for explaining the reduction of an external quantum efficiency in a conventional vertical GaN-based LED;

FIGS. 2A to 2C are sectional views illustrating a method of manufacturing a vertical GaN-based LED disclosed in U.S. Patent Publication No. 20030222263;

FIGS. 3A to 3C are enlarged sectional views illustrating a method of manufacturing the vertical GaN-based LED of FIGS. 2A to 2C;

FIG. 4 is a sectional view of the vertical GaN-based LED manufactured by the method of FIGS. 2A to 2C and FIGS. 3A to 3C;

FIG. 5 is a perspective view of a vertical GaN-based LED according to an embodiment of the present invention;

FIG. 6 is a schematic view of uneven patterns in the vertical GaN-based LED of FIG. 5;

FIGS. 7A and 7B are energy band diagrams illustrating an AlGaN/GaN heterojunction band structure and an AlGaN/GaN/AlGaN heterojunction band structure adopted to the vertical GaN-based LED of FIG. 5;

FIGS. 8A to 8H are sectional views illustrating a method of manufacturing a vertical GaN-based LED according to an embodiment of the present invention; and FIG. 9 is a perspective view illustrating the surface of a sapphire substrate composed of the uneven patterns of FIG. 8C.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Hereinafter, a vertical GaN-based LED and a method of manufacturing the same according to the embodiments of the present invention will be described in detail with reference to the accompanying drawings.

[Structure of Vertical GaN-based LED]

A structure of a vertical GaN-based LED according to an embodiment of the present invention will be described in detail with reference to FIGS. 5 to 7B.

FIG. 5 is a perspective view of a vertical GaN-based LED according to an embodiment of the present invention, FIG. 6 is a schematic view of uneven patterns in the vertical GaN-based LED of FIG. 5, and FIGS. 7A and 7B are energy band diagrams illustrating an AlGaN/GaN heterojunction band structure and an AlGaN/GaN/AlGaN heterojunction band structure adopted to the vertical GaN-based LED of FIG. 5.

Referring to FIG. 5, an n-electrode 170 made of Ti/Al is formed on the uppermost portion of a vertical GaN-based semiconductor LED.

A first n-type GaN layer 150a is formed under the n-electrode 170. At this point, uneven patterns 180 each having a hemispherical shape are formed on the first n-type GaN layer 150a. The uneven patterns 180 are arranged two-dimensionally, i.e., horizontally and vertically. Therefore, the uneven patterns 180 substantially increase the surface area of the first GaN layer 150a.

The uneven patterns 180 are not limited to the hemispherical shape. However, when the uneven patterns 180 have the hemispherical shape, the surface area thereof increases even more, so that the uneven patterns 180 can serve as an excellent optical lens.

Particularly, the present invention further provides a plurality of protuberances 190a formed on the surfaces of the uneven patterns 180. Since the protuberances 190a can be formed using a wet etching process, a plurality of protuberances 190b can be formed on regions between the uneven patterns 180 as well as the surfaces of the uneven patterns 180 as illustrated in FIG. 5.

Compared to the structure of the uneven patterns 180, each of the protuberances 190a and 190b has a fine structure to scatter an emitted light with a predetermined wavelength at the surfaces of the protuberances 190a, thus improving the light-extraction efficiency. Further, the uneven patterns 180 have lateral sides tapered upwardly in order to easily form the protuberances 190a and 190b.

The uneven patterns 180 employed in the present embodiment will be described below in more detail with reference to FIG. 6.

Referring to FIG. 6, the relatively large uneven patterns 180 are formed on the first n-type GaN layer 150a in order to increase the surface area of the first n-type GaN layer 150a. Each size of the uneven patterns 180 sufficiently increases the surface area and is determined in consideration of an optical aspect. Preferably, the uneven patterns 180 have a lower width W1 of 0.5 μm to 5 μm and a height h of 0.1 μm to 5 μm. Further, as illustrated in FIG. 6, the uneven patterns 180 have an interval W2 of 0.1 μm to 5 μm. so as to increase the surface area sufficiently.

In addition, the plurality of protuberances 190a and 190b having a relatively fine structures are formed on the surfaces of the uneven patterns 180 and the regions between the uneven patterns. Because the plurality of protuberances 190a and 190b so as to be the surface increased by the uneven patterns 180, the light-extraction efficiency can increase as a whole. That is, light (a) generated from the active layer reaches the surface increased by the uneven patterns 180 and thus an amount of the light increases, and light (b) reached on the increased surface is scattered by the plurality of protuberances 190a and 190b and can be effectively emitted to the outside. To obtain the light-scattering effect sufficiently, the plurality of protuberances 190a and 190b have a period of 0.001 μm to 1 μm and a height of 0.001 μm to 2 μm.

On the other hand, to enhance a current diffusion effect, a transparent conductor layer 160 may be formed on an interface between the n-electrode 170 and the first n-type GaN layer 150a, more specifically, selectively on an entire surface of the first n-type GaN layer 150a having the uneven patterns 180.

A first AlGaN layer 200a and a GaN layer 210 are sequentially laminated under the first n-type GaN layer 150a to form a heterojunction structure having a first 2D electron-gas layer (2DEG) 220a, which is intended for reducing an operating voltage and enhancing a current dispersion effect compared to the structure of the uneven patterns 180.

The above-mentioned heterojunction structure in which the AlGaN layer and the GaN layer are sequentially laminated will be described in more detail with reference to FIGS. 7A and 7B.

Referring to FIG. 7A, due to the energy-band discontinuity between the first AlGaN layer 200a and the GaN layer 210, the first AlGaN layer 200a has the first 2D electron-gas layer 220a on an interface between the first AlGaN layer 200a and the GaN layer 210. Because high carrier mobility (about 1500 $cm^2$/Vs) is guaranteed in the first 2D electron-gas layer 220a, a current dispersion effect can be remarkably improved.

A preferred formation condition of the first 2D electron-gas layer 220a can be explained by each thickness (t1 and t2 in FIG. 5) of the first AlGaN layer 200a and the GaN layer 210 and Al content of the first AlGaN layer 200a.

More specifically, the thickness t1 of the first AlGaN layer 200a may be changed depending on the Al content. When the Al content is large, crystalinity may be reduced. Therefore, it is preferable that the Al content of the first AlGaN layer 200a be limited to the range of 10-50%. Under such an Al content, it is preferable that the thickness of the first AlGaN layer 200a be in the range of about 100 Å to 500 Å. In this embodiment, the current diffusion effect can be achieved by forming the first AlGaN layer 200a to a thickness of 200 Å to 350 Å. When the first AlGaN layer 200a has a thickness of 500 Å or more, the first AlGaN layer 200a can also perform a current blocking function.

In addition to the n-type AlGaN layer, an undoped AlGaN layer may also be used for the first AlGaN layer 200a for forming the first 2D electron-gas layer 220a. In forming the n-type AlGaN layer, silicon or oxygen can be used as n-type impurities.

Preferably, the thickness t2 of the GaN layer 210 is in a range of about 50 Å to 500 Å in consideration of a tunneling phenomenon of the first 2D electron-gas layer 220a. In this embodiment, the GaN layer 210 is formed to have a thickness of 80 Å to 200 Å.

In addition to the n-type GaN layer, an undoped GaN layer may also be used for the GaN layer 210. Specifically, when the undoped GaN layer is used, impurity scattering or the like can be prevented from occurring in a layer where the 2D electron-gas layer is formed. Consequently, the current diffusion can be easily achieved and the undoped GaN layer can cut off a current flowing in a vertical direction.

As described above, the present invention can solve a current crowding problem through the current diffusion by applying the AlGaN/GaN heterojunction structure under the first n-type GaN layer 150a.

On the other hand, since the GaN/AlGaN heterojunction structure is used in which the second AlGaN layer 200b is provided under the GaN layer 210 so as to form unevenness that can improve the external quantum efficiency, the second 2D electron-gas layer 220b is formed on the interface between the GaN layer 210 and the second AlGaN layer 200b. Like the first 2D electron-gas layer 220a, the second 2D electron-gas layer 220b can remarkably improve the current diffusion characteristic (see FIG. 4B). That is, the first AlGaN layer 200a and the second AlGaN layer 200b formed up and down from the GaN layer 210 have the 2D electron-gas layer divided into the first and second 2D electron-gas layers 220a and 220b because of their respective heterojunction structures. Accordingly, the operating voltage of the LED is reduced and the current dispersion effect is enhanced even more. Consequently, the high power semiconductor LED can be implemented. At this point, the height and Al content of the second AlGaN layer 200b are the same as those of the first AlGaN layer 200a.

A GaN-based LED structure where a second n-type GaN layer 150b, an active layer 140, and a p-type GaN layer 130 are sequentially laminated is formed under the second AlGaN layer 200b.

The first and second n-type GaN layers 150a and 150b and the p-type GaN layer 130 may be a GaN layer or a GaN/AlGaN layer doped with conductive impurities. The active layer 140 can have a multi-quantum well structure formed of an InGaN/GaN layer.

A p-electrode 120 is formed under the p-type GaN layer 130 of the GaN-based LED structure. Although not shown, a p-electrode and a reflection layer may be sequentially laminated under the p-type GaN layer 140. When the reflection layer is not provided, the p-electrode acts as a reflection layer.

A structure support layer 110 is attached under the p-electrode 120 through a conductive adhesive layer (not shown). The structure support layer 110 acts as a support layer and an electrode of a final LED and is formed of a silicon substrate, a GaAs substrate, a Ge substrate, or a metal layer. The metal layer may be formed using electroplating, electroless plating, thermal evaporator, e-beam evaporator, sputter, or chemical vapor deposition (CVD).

[Method for Manufacturing Vertical GaN-based LED]

A method for manufacturing a vertical GaN-based LED according to an embodiment of the present invention will be descried in detail with reference to FIGS. 8A to 8H and 9.

FIGS. 8A to 8H are sectional views illustrating a method of manufacturing a vertical GaN-based LED according to an embodiment of the present invention, and FIG. 9 is a perspective view illustrating a surface of a sapphire substrate composed of the uneven patterns of FIG. 8C.

Referring to FIG. 8A, photosensitive polymer is coated to a thickness of 0.1 μm to 5 μm on a substrate 100 using photolithography. Next, the photosensitive polymer is patterned into a predetermined shape having an interval of 0.5 μm to 5 μm using a light reaction and mask to form a photoresist pattern 300a. The photoresist pattern 300a may not be formed on a predetermined portion of the substrate 100 in consideration of a portion on which an n-electrode is to be formed during a subsequent process.

In this embodiment, the photosensitive polymer is patterned into a rectangular shape having an interval of 0.5 μm to 5 μm by using a grating-shaped mask. Also, the substrate 100 is a substrate suitable for growing nitride semiconductor monocrystal and may be a heterogeneous substrate, such as a sapphire substrate and a SiC substrate, or a homogeneous substrate, such as a nitride substrate.

Referring to FIG. 8B, the rectangular photoresist pattern 300a is re-flowed at temperature of 100° C. to 150° C. for about 1-5 minutes to form a hemispherical photoresist pattern 300b.

With the hemispherical photoresist pattern 300b being used as a mask, portions of the substrate 100 are selectively etched as much as a predetermined thickness. The etching process may be performed by an Inductively Coupled Plasma Reactive Ion Etching (ICP-RIE) process using BCl3 and HBr gases.

The hemispherical photoresist pattern 300b and the predetermined upper surface of the substrate 100 are simultaneously etched. Consequently, the surface of the substrate 100 is etched to have hemispherical patterns 100a as illustrated in FIG. 8C. FIG. 9 is a perspective view illustrating a surface of a sapphire substrate including the uneven patterns of FIG. 8C.

Referring to FIG. 8D, a GaN-based buffer layer 400 is crystal-grown on the substrate 100 having the hemispherical patterns 100a using a known nitride deposition process, such as Metal Organic Chemical Vapor Deposition (MOCVD) and Molecular Beam Epitaxy (MBE), and then a first n-type GaN layer 150a is formed on the GaN-based buffer layer 400.

A first AlGaN layer 200a and a GaN layer 210 are sequentially laminated on the first n-type GaN layer 150a to form a heterojunction structure having a first 2D electron-gas layer 220a.

The first AlGaN layer 200a and the GaN layer 210 can be formed in-situ in a chamber where the deposition of the nitride layer is performed. Further, a thickness of the GaN layer 210 where the first 2D electron-gas layer 220a is formed is in a range of 50 Å to 500 Å. The thickness of the first AlGaN layer 200a may be in the range of 50 Å to 500 Å in consideration of the preferred Al content, and more preferably, may be in the range of 200 Å to 350 Å. Al content of the first AlGaN layer 200a is limited to a range of 10% to 50% in consideration of the preferable Al content in order to prevent crystalinity reduction caused by excessive Al content.

Additionally, the first AlGaN layer 200a may be an n-type AlGaN layer doped with Si, which is n-type impurity, but is not limited thereto. An undoped AlGaN layer may also be used as the first AlGaN layer 200a.

On the other hand, after the first AlGaN layer 200a is formed, an annealing process can be performed on the first AlGaN layer 200a under $O_2$ atmosphere. The annealing process can be selectively performed, if necessary, and is intended for artificially increasing an amount of oxygen serving as a donor. As described above, since an annealing process is used for improving crystalinity, the annealing process according to the present invention can be easily realized using oxygen as an atmosphere gas.

Next, a second AlGaN layer 200b is formed on the GaN layer 210 constituting the heterojunction structure, so that a heterojunction structure having a second 2D electron-gas layer 220b is formed by sequentially laminating the GaN layer 210 and the second AlGaN layer 200b.

Thereafter, a second n-type GaN layer 150b, an active layer 140, and a p-type GaN layer 130 are sequentially crystal-grown on the second AlGaN layer 200b to form a GaN-based LED structure.

A p-electrode 120 is formed on the p-type GaN layer 130. The p-electrode 120 can act as a reflection layer. On the other hand, a reflection layer (not shown) performing a reflection function separately can be formed on the p-electrode 120.

After a conductive junction layer (not shown) for attaching a structure support layer on the p-electrode 120 using an eutectic bonding method is formed, predetermined temperature and pressure are applied to the conductive junction layer, so that the structure support layer 110 is bonded with the conductive junction layer. At this point, the structure support layer 110 acts as a support layer and an electrode of a final LED and can be formed of a silicon substrate, a GaAs substrate, a Ge substrate, or a metal layer. The metal layer may be formed using electroplating, electroless plating, thermal evaporator, e-beam evaporator, sputter, or chemical vapor deposition (CVD).

Referring to FIG. 8E, the substrate 100 is removed by an LLO process to expose the surface of the buffer layer 400 located on the substrate 100. At this point, the exposed surface of the buffer layer 400 has uneven patterns caused by the hemispherical patterns 100a formed in the surface of the substrate 100.

Referring to FIG. 8F, the buffer layer 400 is removed by an etching process without any separate mask. Then, the upper surface of the first n-type GaN layer 150a located under the buffer layer 400 is also partially etched during the etching of the buffer layer 400 to have the same surface as the surface of the buffer layer 400 having uneven patterns. That is, the upper surface of the first n-type GaN layer 150a also has hemispherical uneven patterns 180. The etching process may be performed using ICP-RIE. Next, wet etching is performed on the surface of the first n-type GaN layer 150a having the uneven patterns 180.

Referring to FIG. 8G, a plurality of protuberances 190a and 190b are formed by wet etching on the surfaces of the uneven patterns 180 and regions between the uneven patterns. A direction and a structure of the protuberances 190a and 190b are determined by a crystal direction of the etched layer. The protuberances 190a and 190b can have a fine structure having light-scattering effect. The wet etching process for obtaining preferable protuberances 190a and 190b can be performed at the temperature range of about 75° C. to 100° C. using an etching solution such as KOH.

On the other hand, the plurality of protuberances 190a and 190b can also be formed by a wet etching process using KOH as an etching solution and a dry etching process using ICP-RIE.

Referring to FIG. 8H, an n-electrode 170 is formed on the first n-type GaN layer 150a where the plurality of protuberances 190a and 190b are formed. Thereafter, a device isolation process is performed through laser scribing, wet etching, or drying etching, or the n-electrode 170 is formed after a device isolation process to form a vertical GaN-based LED.

On the other hand, according to the present embodiment, a transparent conductor layer 160 may be selectively formed on the upper entire surface of the first n-type GaN layer 150a before the n-electrode 170 is formed, in order to enhance the current diffusion effect.

As described above, uneven patterns are formed as macroscopic structures in order to increase the surface area, and simultaneously, a plurality of protuberances having fine light-scattering structures are easily formed in the surfaces of the uneven patterns without any separate photolithography. Consequently, the light-extraction efficiency can be improved and the external quantum efficiency can be maximized.

In addition, the heterojunction structure of AlGaN/GaN is adopted to the inside of the n-type GaN layer to minimize the contact resistance of the n-type GaN layer through the tunneling phenomenon by the 2D electron-gas layer. Therefore, the operating voltage of the vertical GaN-based LED can be reduced and the current dispersion effect can be improved, which results in high power.

Furthermore, because the present invention can achieve high carrier mobility and concentration using the 2D electron-gas layer, the excellent effect is created in the current injection efficiency.

Therefore, the present invention can improve the characteristics and reliability of the vertical GaN-based LED and can simplify the process of forming uneven patterns, improving the manufacturing yield.

While the present invention has been described with reference to exemplary embodiments thereof, it will be understood by those skilled in the art that various changes and modifications in form and detail may be made therein without departing from the scope of the present invention as defined by the following claims.

What is claimed is:

1. A vertical GaN-based LED (light emitting diode) comprising:
   an n-electrode;
   a first n-type GaN layer having uneven patterns including a plurality of protuberances for increasing a surface area and formed under the n-electrode;
   a first AlGaN layer formed under the first n-type GaN layer;
   a GaN layer formed under the first AlGaN layer;
   a second AlGaN layer formed under the GaN layer;
   a second n-type GaN layer formed under the second AlGaN layer;
   an active layer formed under the second n-type GaN layer;
   a p-type GaN layer formed under the active layer;
   a p-electrode formed under the p-type GaN layer; and
   a structure support layer formed under the p-electrode.

2. The vertical GaN-based LED according to claim 1, wherein each of the uneven patterns has a lower width of 0.5 μm to 5 μm.

3. The vertical GaN-based LED according to claim 1, wherein each of the uneven patterns has a height of 0.1 μm to 5 μm.

4. The vertical GaN-based LED according to claim 1, wherein each of the uneven patterns has a lateral side tapered upwardly.

5. The vertical GaN-based LED according to claim 4, wherein the uneven patterns are hemispherical patterns arranged vertically and horizontally.

6. The vertical GaN-based LED according to claim 1, wherein the uneven patterns are arranged at an interval of 0.1 μm to 5 μm.

7. The vertical GaN-based LED according to claim 1 further comprising
   a plurality of protuberances additionally formed in regions between the uneven patterns.

8. The vertical GaN-based LED according to claim 7, wherein the plurality of protuberances are formed at a period of 0.001 μm to 5 μm.

9. The vertical GaN-based LED according to claim 7, wherein the plurality of protuberances are formed to have a height of 0.001 μm to 2 μm.

10. The vertical GaN-based LED according to claim 1, wherein each of the first AlGaN layer and the second AlGaN layer has a thickness of 100 Å to 500 Å.

11. The vertical GaN-based LED according to claim 1, wherein Al content of the first AlGaN layer and the second AlGaN layer is in the range of 10% to 50%.

12. The vertical GaN-based LED according to claim 1, wherein each of the first AlGaN layer and the second AlGaN layer is an undoped AlGaN layer.

13. The vertical GaN-based LED according to claim 1, wherein each of the first AlGaN layer and the second AlGaN layer is an AlGaN layer doped with n-type impurities.

14. The vertical GaN-based LED according to claim 1, wherein each of the first AlGaN layer and the second AlGaN layer includes silicon or oxygen as impurities.

15. The vertical GaN-based LED according to claim 1, wherein the GaN layer has a thickness of 50 Å to 500 Å.

16. The vertical GaN-based LED according to claim 1, wherein the GaN layer is an undoped GaN layer.

17. The vertical GaN-based LED according to claim 1, wherein the GaN layer is a GaN layer doped with n-type impurities.

18. The vertical GaN-based LED according to claim 1 further comprising a transparent conductor layer located between the n-electrode and the first n-type GaN layer and formed on the entire surface of the first n-type GaN layer.

19. The vertical GaN-based LED according to claim 1 further comprising a 2D (two-dimensional) electron-gas layer located at the interface between the first AlGaN layer and the GaN layer and an interface between the GaN layer and the second AlGaN layer.

* * * * *